US006173434B1

(12) United States Patent
Wirthlin et al.

(10) Patent No.: US 6,173,434 B1
(45) Date of Patent: *Jan. 9, 2001

(54) DYNAMICALLY-CONFIGURABLE DIGITAL PROCESSOR USING METHOD FOR RELOCATING LOGIC ARRAY MODULES

(75) Inventors: Michael J. Wirthlin; Brad L. Hutchings, both of Provo, UT (US)

(73) Assignee: Brigham Young University, Provo, UT (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/787,402

(22) Filed: Jan. 22, 1997

(51) Int. Cl.[7] ........................... H03K 19/00; G06F 17/50; G06F 9/455
(52) U.S. Cl. ................................ 716/17; 716/8; 703/23
(58) Field of Search .................... 364/488, 489, 364/490; 395/500.18, 500.44; 716/17, 8; 703/23

(56) References Cited

U.S. PATENT DOCUMENTS

| | | | | |
|---|---|---|---|---|
| 5,612,891 | * | 3/1997 | Butts et al. ........................ | 364/489 |
| 5,633,806 | * | 5/1997 | Yusa et al. ........................ | 364/490 |
| 5,687,325 | * | 11/1997 | Chang ................................ | 364/488 |
| 5,745,372 | * | 4/1998 | Fluegge ............................. | 364/489 |
| 5,761,077 | * | 6/1998 | Shackleford ..................... | 364/489 |
| 5,761,078 | * | 6/1998 | Fuller et al. ...................... | 364/489 |
| 5,787,007 | * | 7/1998 | Bauer ................................. | 364/489 |

OTHER PUBLICATIONS

National Semiconductor, Configurable Logic Array (CLAy) Configuration Datasheet, 1993.
National Semiconductor, Configurable Logic Array (CLAy), 1993.
National Semiconductor, Configurable Logic Array Software System (CLASS), 1991.
National Semiconductor, CLAy Tools Design Software, 1993.

* cited by examiner

Primary Examiner—Kevin J. Teska
Assistant Examiner—Hugh Jones
(74) Attorney, Agent, or Firm—Lloyd W. Sadler (57) ABSTRACT

A method for relocating modules within a programmable logic array is disclosed and used to produce a dynamically-reconfigurable digital processor. The method consists of creating relocatable intermediate circuit modules that can be stored in a configuration library. These modules contain the computation engine and its control logic for executing a portion of an application. When a new module needs to be loaded, an unused portion of the programmable logic array of sufficient size is located, the module from the configuration library is relocated, and the final circuit module is placed in the programmable logic array, configuring it for executing the portion of the application.

23 Claims, 6 Drawing Sheets

FIG. 1

FIG. 2A
Configuration Library

FIG. 2B
FPGA System Configuration 1

FIG. 2C
FPGA System Configuration 2

FIG. 2D
FPGA System Configuration 3

DYNAMICALLY-CONFIGURABLE DIGITAL PROCESSOR USING METHOD FOR RELOCATING LOGIC ARRAY MODULES

BACKGROUND OF THE INVENTION

1. Field of the Invention

This invention relates to digital computers and programmable logic arrays in general, and specifically to techniques for programming a programmable logic array and for implementing a dynamically-configurable digital processor, by allowing circuit modules to be dynamically relocated within a programmable logic array.

2. Description of Related Art

Figure 1:
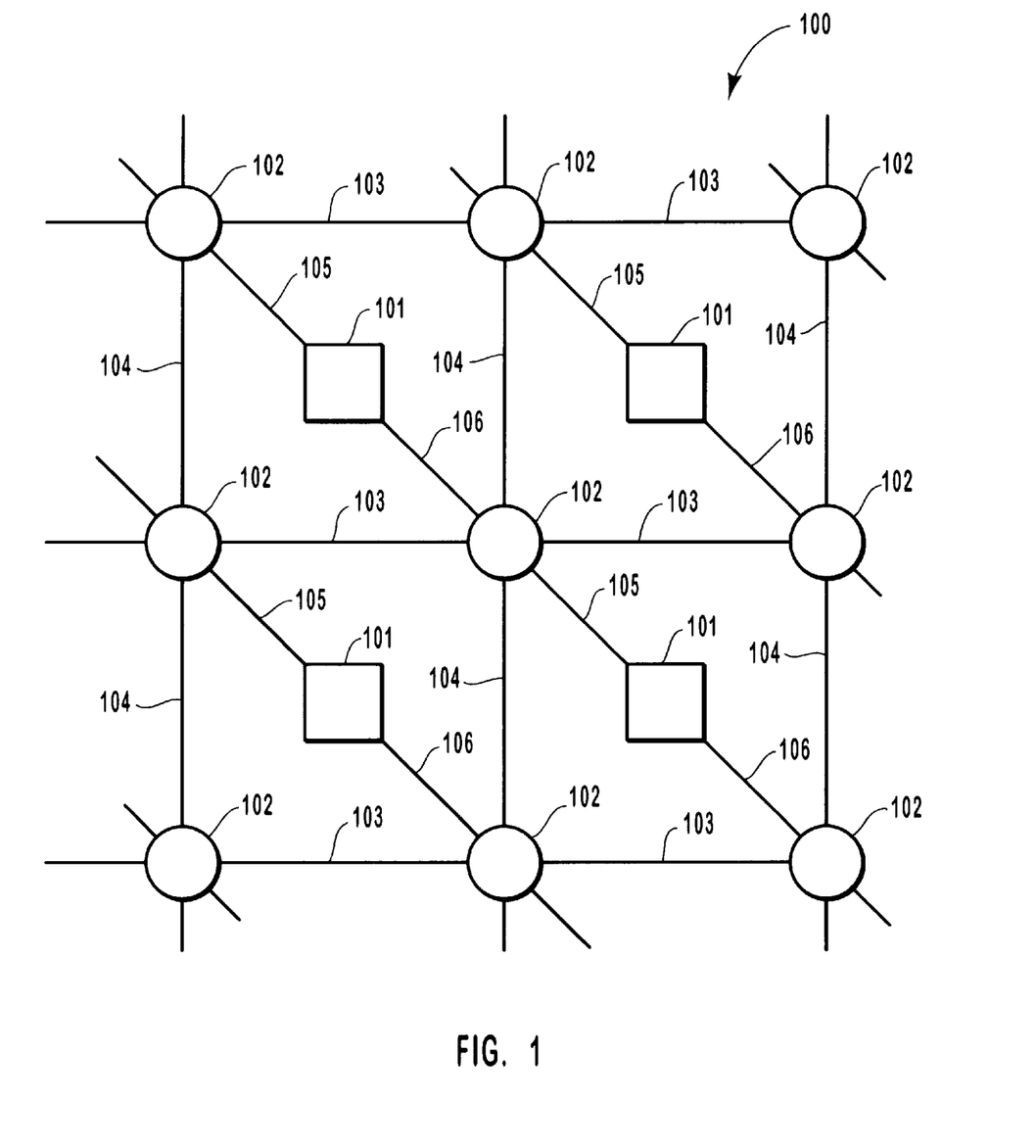
FIG. 1 illustrates a representative programmable logic array.

Programmable logic arrays are well-known in the art. FIG. 1 illustrates a representative programmable logic array 100, intended to illustrate the general nature of programmable logic arrays and not any particular implementation of a programmable logic array. As seen in FIG. 1, programmable logic array 100 has two types of programmable elements: logic elements 101 and routing elements 102. There are also both horizontal busses 103 and vertical busses 104 carrying signals between routing elements 102, and input busses 105 and output busses 106 carrying signals to and from logic elements 101, respectively.

Each routing element 102 can be programmed to direct particular digital signals to neighboring routing elements 102 across horizontal buss 103 or vertical buss 104, and to their adjacent logic element 101. Each logic element 101 takes the digital signals on its input buss 105, performs one or more specified boolean logic operations, and places the results of the operation on its output buss 106. Logic elements 101 may also contain memory devices in addition to combination logic.

The design of a programmable logic array is equivalent to the construction of a digital circuit. The logical operations to be performed are produced by programming logic elements 101, and the logic elements 101 are connected by programming routing elements 102.

It is possible to have programmable logic arrays which have fixed functions in their logic elements, or a fixed routing between their logic elements. This often results in a programmable logic array with higher densities of functions, but with considerable less design flexibility. In any case, such programmable logic arrays are within the scope of this invention.

Early programmable logic arrays were designed either by adding a final layer of metalization to an incomplete integrated circuit, or by blowing fuse links located in key positions in the logic and routing elements. Both of these techniques resulted in fixed programmable logic arrays that could not be changed after the programmable logic arrays were configured. Recently, programmable logic arrays using switching elements controlled by static memory devices have become available. With these SRAM-based programmable logic arrays, the configuration information is written to memory elements within the programmable logic array. Those memory elements then control switching elements in key locations in the logic and routing elements of the programmable logic array. This allows for the connection (as with the metalization layer) or disconnection (as with the fuse links) of the prior programmable logic arrays, but with the ability to change the configuration of the programmable logic array at any time by simply changing the information stored in the memory elements.

Of particular interest for this invention are SRAM-based programmable logic arrays that allow the changing of only part of their configuration, without the necessity of changing the entire configuration. Such programmable logic arrays include the Configurable Logic Array (CLAy) produced by National Semiconductor, the 6200 series produced by Xilinx, and devices from Atmel.

SRAM-based programmable logic arrays are clearly more versatile than fixed programmable arrays, that are programmed by adding or removing internal wires, because SRAM-based programmable logic arrays can be conveniently reconfigured at any time. But because of the extra logic required for the SRAM-based control of the programmable logic array, they cannot achieve the density of fixed programmable logic arrays, perhaps by as much as a factor of ten. But by reprogramming the SRAM-based programmable array with functions as they are required, and not having portions of the logic array resident unless necessary, an SRAM-based programmable logic array can effectively implement the functions of a fixed programmable logic array with far more logic elements.

While there are many uses for programmable logic arrays, one important use is in the implementation of programmable digital processors that implement instruction sets optimized for particular applications. Rather than having a conventional digital computer with a general arithmetic-logic unit handling the computations, computation engines can be formed from one or more programmable logic arrays. These computation engines efficiently perform the logical and computational operations desired for the particular application. One or more programmable logic arrays can also be used to sequence the computation engines, or a single programmable logic array could contain both computation engines and their control logic.

With the advent of SRAM-based programmable logic arrays, a digital processor that can be adapted to different applications becomes possible. The programmable logic arrays implementing the processor are configured for a particular application, the operations of that application are performed, and the programmable logic arrays are then programmed for the next application. A variety of such programmable digital processors have been described in the prior art. But prior art programmable digital processors have required that the programmable logic arrays contain all computation engines and their control logic needed for a particular application while that application is being performed. This often requires a large number of logic and routing elements in the programmable logic arrays implementing the programmable digital processor, most of which are not used at any given time.

A solution would be to assemble the computation engine and its control logic for a portion of the application into an application-specific instruction module, store that module in a configuration library, and then place that application-specific instruction module into the instruction space of the programmable digital processor formed by the programmable logic arrays whenever that portion of the application is to be performed. However, that is difficult or impossible with prior art systems.

FIGS. 2a, 2b, 2c, 2d, 2e and 2f illustrate the problem with past approaches. The configuration library contains application-specific instruction modules A, B, C, and D. Modules A, B, and C are all the same size, but have been created to be placed into different locations in the programmable logic array, as indicated by their location in their depiction of the configuration library, see FIG. 2a.

Figure 2A:
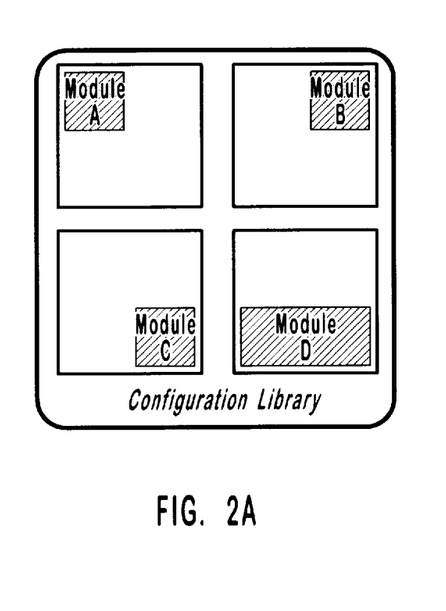
FIGS. 2a, 2b, 2c, 2d, 2e and 2f illustrate how modules from a configuration library can be loaded into a programmable logic array.
Figure 2B:
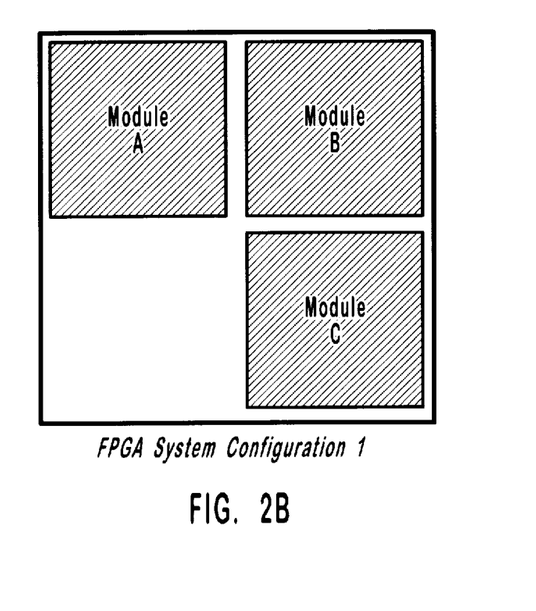
Figure 2C:
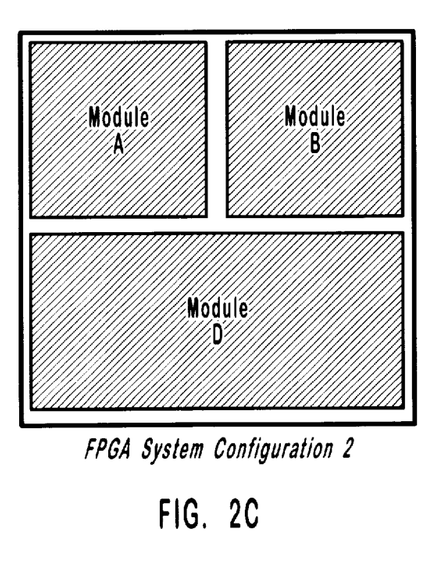

FPGA system configuration 1, see FIG. 2b shows modules A, B, and C placed into the programmable logic array. FPGA system configuration 2, see FIG. 2c shows the arrangement of modules in the programmable logic array after module C is no longer needed and has been replaced with module D.

Figure 2D:
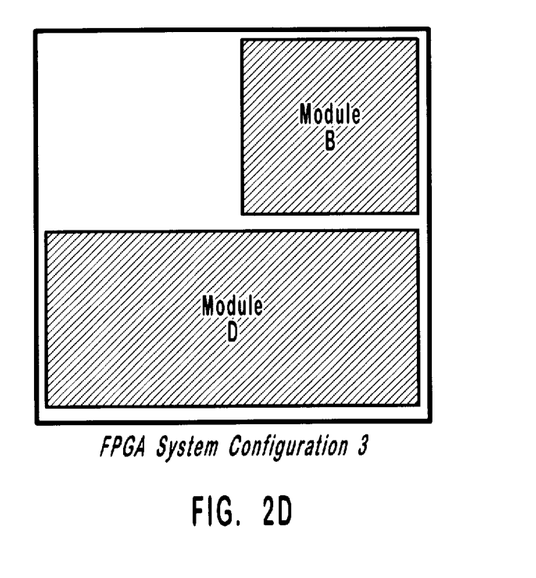

The problem occurs when module A is no longer needed, and module C is again needed. Module C cannot be placed into the programmable logic array, even though there is sufficient room left by the removal of module A, as shown in FIG. 2d. Module C must be placed into lower-right corner of the programmable, but a portion of module D is already located there and cannot be removed.

Figure 2E:
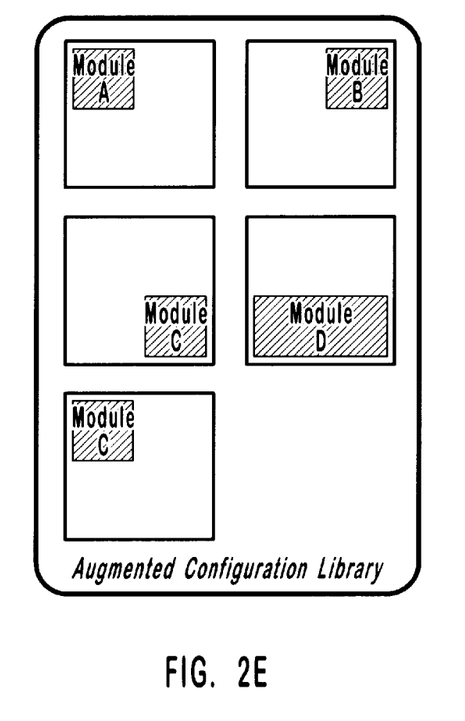
Figure 2F:
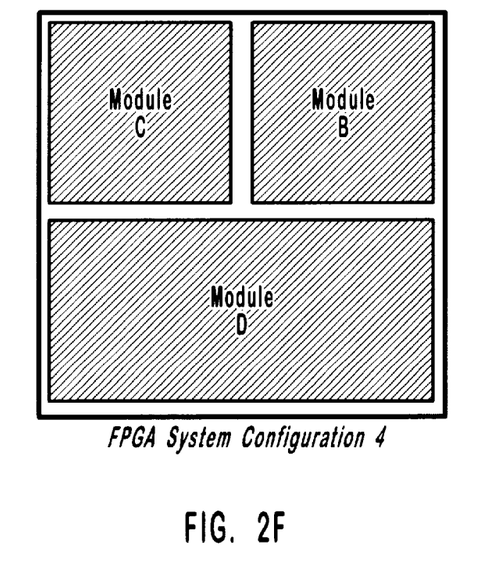

One solution would be to create an augmented configuration library, see FIG. 2e with a second version of module C, this time created to fit into the upper-left corner of the programmable logic array. The original version of module C is used along with modules A and B, and the second version of module C is used along with modules B and D. As can be seen in FPGA system configuration 4, see FIG. 2f, modules B, C (second version), and D can now reside simultaneously in the programmed logic array.

While this may work for the simple example, only requiring the creation of a second version for one module, in a complex system it would be impractical to create alternative modules. Each combination of modules possible at any time would have to be determined, and any alternative modules needed to produce that combination would have to be created. If that could not be determined, then alternatives for every possible combination of modules would have to be examined.

For efficiency considerations, not only would every possible combination of modules have to be examined, but the prior combination of modules would also have to be considered. For example, the example above shows how a second module C solves the problem when module C is replaced by module D, then module A is replaced by module C. But if module A is replaced by module D, either the original module C must be replaced with the second module C before module D is placed (requiring extra time), or a second module D, fitting in the left half (rather than the bottom half) of the programmable logic array is necessary.

SUMMARY OF THE INVENTION

It is an object of this invention to provide a method where a module can be placed in any unused portion of the programmable logic array that is of sufficient size to hold it. A portion of a programmable logic array can be unused either because no function has ever been specified for that portion, or the function previously specified for that portion is no longer necessary.

This is achieved by creating an intermediate circuit module that can be relocated within the programmable logic array, then finding a currently-unused portion of the programmable logic array of sufficient size to hold the intermediate circuit module, then producing a final circuit module by relocating the intermediate circuit module such that it can be placed in the unused portion, and finally configuring the programmable logic array by placing the final circuit module into the programmable logic array.

It is another object of this invention to implement a programmable digital processor that uses the method of this invention to place application-specific instruction modules into the instruction space formed by one or more programmable logic arrays, as needed by the execution of a particular application. This is achieved by creating a set of intermediate circuit modules, each of which implements an application-specific instruction module's computation engine and its control logic, and storing these intermediate circuit modules in a configuration library. Whenever the application requires a particular application-specific instruction module, its intermediate circuit module is read from the configuration library, relocated according to the method of this invention, and placed in the programmable logic array or arrays of the programmable digital processor.

These and other features of the invention will be more readily understood upon consideration of the attached drawings and of the following detailed description of those drawings and the presently preferred embodiments of the invention.

DETAILED DESCRIPTION OF THE INVENTION

Figure 3:
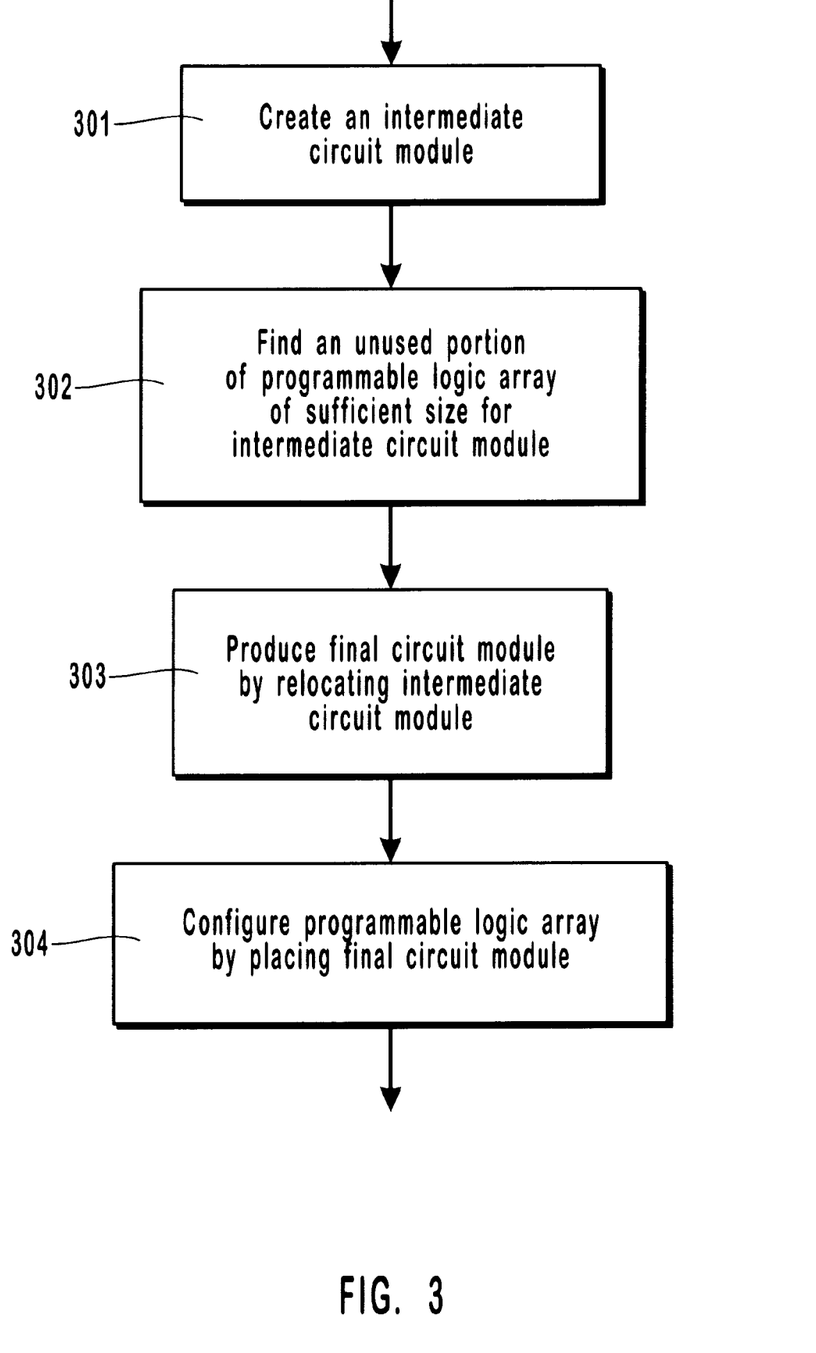
FIG. 3 is a flow diagram illustrating the major steps of the method of the invention.

FIG. 3 illustrates the four major steps of the method of the invention. In step 301, an intermediate circuit module is created in a way that allows the intermediate circuit to be relocated within the programmable logic array. In step 302, an unused portion of the programmable logic array of sufficient size to hold said intermediate circuit module is found. In step 303, a final circuit module is produced by relocating the intermediate circuit module such that it can be placed in said unused portion. Finally, in step 304, the programmable logic array is configured by placing the final circuit module into the programmable logic array at the unused portion.

The particular way these steps are implemented depends on the characteristics of the programmable logic array being used. The following discussion describes in general how these steps can be implemented, and presents the currently-preferred embodiment of the method. Implementation of the method of this invention for a particular programmable logic array will be straightforward for one skilled in the art of logic implementation using programmable logic arrays and the development of computer-based design tools for such programmable logic arrays.

Prior Art Design Methods

In prior art design systems, the first step in developing a programmable logic array is for the design to be entered either as a schematic diagram or as text for a synthesis tool. The description is then processed to produce a netlist that describes the necessary logic elements and their interconnection. This netlist does not indicate the specific location of any logic element or the routing between elements. Optionally, at this point, the netlist can be processed by an optimizer to reduce the complexity of the logic required for the design.

At this point, the netlist is converted to an actual physical layout for the programmable logic array by placement and routing software. The placement and routing software determines what physical resources on the programmable logic array will be used to implement the logic functions and the routing. At this point, the design is locked to a particular location within the programmable logic array.

The final development step is to convert the geometry file produced by the placement and routing software to the format actually needed to configure the programmable logic array. This format is determined by the particular programmable logic array and the device being used to program it. It is not possible at this step to change the locations for logic elements and the routing determined during the previous placement and routing.

Relocatable Modules

In the method of this invention, the development of a relocatable module also begins with the specification of the module using either a schematic diagram or text for a synthesis tool. A netlist is also produced, which can he optimized if desired. Placement and routing is also performed, as with the prior art techniques.

However, rather than have the placement and routing step lock the design to a particular location within the programmable logic array, it produces a module that is capable of being placed in a variety of locations within the programmable logic array. This intermediate design is then placed in a configuration library for later reference. This completes step 301 of the method.

When it is desired to use a particular intermediate design from the configuration library, the method of this invention attempts to find an unused portion of the programmable logic array that is of sufficient size for the intermediate circuit module. A portion of a programmable logic array can be unused either because no function has ever been specified for that portion, or the function previously specified for that portion is no longer necessary. This process is similar to finding an unused portion of a computer's memory capable of holding a program module, and techniques well-known in the art can be used here after being adapted to account for any physical constraints imposed by a particular type of programmable Logic array.

If there is not a free portion of the programmable logic array, one or more modules not recently used, or known not to be needed in the immediate future, can be marked as free. If there is enough unused space, but it is not positioned satisfactorily (such as in two or more portions, neither of which is of sufficient size for the intermediate circuit module to be loaded), existing circuit modules in the programmable logic array can be rearranged to give the desired space. Because circuit modules generally do not store information, but simply perform logical operations, this rearrangement can be done by scheduling the reloading of the circuit modules that need to be moved. If a circuit module does store information, that information must be read out of the programmable logic array, and then reentered into the programmable logic array when the circuit module is reloaded.

For some applications, it may be possible to predetermine which circuit modules need to be loaded, and where an unused portion of the programmable logic array will be at the time the circuit module is loaded.

The finding of a suitable unused portion of a programmable logic array, by whatever technique, completes step 302 of the method.

The desired intermediate circuit module is then taken from the configuration library and relocated to produce the final circuit module to be loaded into the programmable logic array. Relocation involves, for example, modifying the bit-stream used to program the programmable logic array by changing the addresses of the logic or routing elements constituting the circuit module.

In particular, with the National Semiconductor CLAy and the Atmel programmable logic arrays, relocation involves bit-stream modification. The bit-streams used to program the programmable logic array are composed of windows with each window including a starting address that indicates the relative physical position of the configuration information on the programmable logic array. Relocating the bit-stream involves the modification of the starting address of the window. Thus, for each window in the bit-stream, step 303 modifies the starting addresses to reflect the desired location within the programmable logic array. There can be any number of windows in a bit-stream, and each of these windows needs to be processed before the bitstream is transferred into the programmable logic array.

The Xilinx 6200 configuration interface is very similar to a conventional random-access memory (RAM). None of the addresses are explicitly stored in the configuration. The physical location of the programming bits is determined by setting external address pins and then writing the addressed location. Thus, there is no need to change the data in the configuration, but the processing in step 303 needs to provide the proper addresses during the configuration of the programmable logic array.

In a system with a plurality of programmable logic arrays, relocation may involve moving a module to a different programmable logic array. Here, no changes need to be made in the configuration information; it just needs to be sent to a different programmable logic array.

There may be ways in the future for doing the relocation directly within the programmable logic array. As with the relocation techniques discussed above, such future relocation techniques do not depart from the scope and spirit of the method of this invention.

Using a technique appropriate to the particular programmable logic array, as described above, step 303 converts the intermediate circuit module, which can be placed in a variety of locations in the programmable logic array, to a final circuit module that can be placed in only a single location within the programmable logic array—the location determined as unused in step 302. This is analogous to a relocating loader for a computer program converting an object module that can be loaded in any location to an executable module placed in a fixed location, although the actual processing techniques are very different. This completes step 303.

Finally, in step 304, the programmable logic array is configured by placing the final circuit module produced by relocation step 303 in the desired location of the programmable logic array. Much like the final development step to convert the geometry file produced by placement and routing software to a format actually needed to configure the programmable logic array in the prior art development method, the actual processing of this step is determined by the particular programmable logic array and the device being used to program it at run-time. If the final circuit module produced by step 303 is in the form of a geometry file such as would be produced by the prior art placement and routing software, essentially the same program can be used here as in the prior art for configuring the programmable logic array.

If the programmable logic array allows the changing of only part of their configuration, without the necessity of changing the entire configuration, only the particular final circuit module needs to be loaded. Programmable logic arrays allowing this include the Configurable Logic Array (CLAy) produced by National Semiconductor and the 6200 series from Xilinx. However, if the entire programmable logic array needs to be reloaded every time, an image of the programmable logic array can be kept, the necessary changes for including the desired final logic module can be made to that image, and the programmable logic array can be completely reprogrammed from that image.

Linear Hardware Space

While the method of the invention covers intermediate circuit modules of arbitrary size and shape being placed anywhere within the programmable logic array, in the presently-preferred embodiment of the method simple constraints are placed on the intermediate circuit modules to improve the efficiency of the relocation process.

Figure 4:
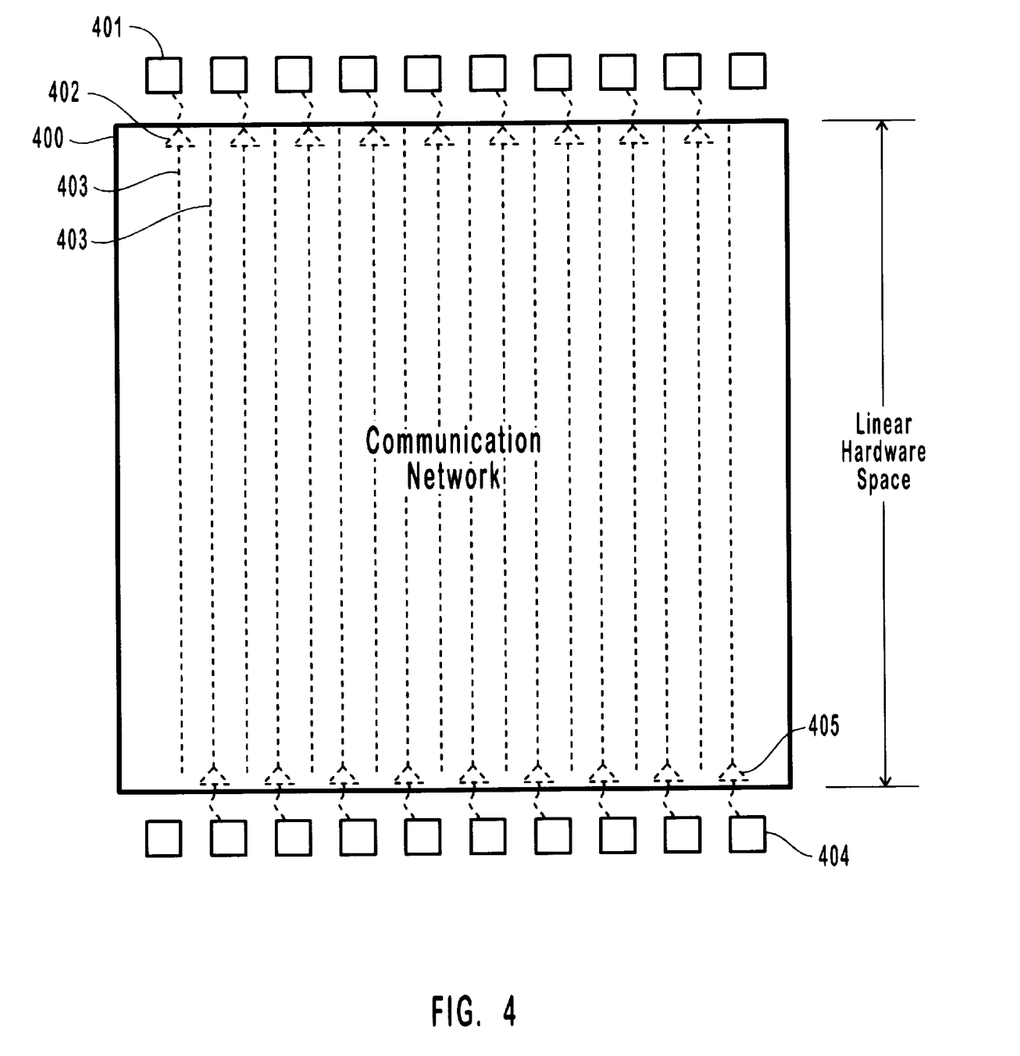
FIG. 4 illustrates a linear hardware space organization of a programmable logic array.

In the presently-preferred embodiment, the programmable logic array is organized as a linear hardware space, as illustrated in FIG. 4. This is not a different type of programmable logic array, but is simply a way of organization that provides a simple and uniform structure for the final circuit modules and their interconnection.

In the linear hardware space, all global signals (input and output signals that may be needed by any final circuit module as well as interconnection signals between final circuit modules) run vertically across the entire programmable logic array. (The terms vertical and horizontal are used as a convenience when looking at FIG. 4, and are not meant to limit this invention beyond that the horizontal and vertical directions are essentially orthogonal to each other.) Output pad 401 is driven through output driver 402 from a vertical signal line 403, and input pad 404, through input driver 405, drives another vertical signal line 403.

Final circuit modules are developed so that they horizontally overlay all global signal lines 103. This assures that every signal necessary for a final circuit module will be available to it. It also reduces relocation from a two-dimensional problem to a one-dimensional problem, since all final circuit modules have the same horizontal size (the width of the programmable logic array), although their vertical size differs as each final circuit module may require a different number of rows of the programmable logic array.

In particular, when using a linear hardware space, step 301 remains essentially the same, since the specification of an intermediate circuit module is independent of the underlying programmable logic array and the specific placement of the module within the programmable logic array. Any optimization performed would have to consider the fixed placement of the vertical signal lines carrying the global signals, and would optimize the size of the intermediate circuit module only in the vertical dimension, since all intermediate circuit modules must be the same size in the horizontal dimension. The placement and routing also would have to consider the fixed placement of the vertical signal lines carrying the global signals. Most placement and routing systems have the capability of handling such fixed constraints, and any modifications necessary to implement step 301 would be straightforward for a person skilled in design automation systems.

Step 302 consists of finding a space whose vertical dimension is at least as large as the vertical dimension of the desired intermediate circuit module. If no such space exists, two or more spaces will need to be combined to form the necessary space. As previously discussed, this will require either the moving of one or more previously-placed final circuit modules within the programmable logic array, or reloading the entire programmable logic array with all the unused space condensed to a single space.

To produce the final circuit module, step 303 simply needs to apply a vertical offset, corresponding to the location determined in step 302, to the intermediate circuit module as stored in the configuration library. Only vertical locations need to be offset; all horizontal locations remain the same regardless of where the final circuit module will be loaded.

Finally, step 304 configures the programmable logic array by placing the final circuit module, using the techniques previously discussed.

Other Embodiments

In another embodiment, the global signal form a bundle of vertical signal lines. These bundles are replicated in two or more places across the programmable logic array. It is only necessary that a final module be placed to overlay one of these bundles of vertical signal lines carrying the global signals. If the bundles are uniformly positioned across the programmable logic array, then the horizontal dimension of the programmable logic array can be regarded as divided into equally-sized segments, each with a bundle of global signals in the same relative location. Circuit modules can then have horizontal sizes equal to one or more segments.

For example, if the there are four horizontal segments in the programmable logic array, then circuit modules can have horizontal sizes of one, two, three, or four segments. Two two-segment modules can be placed horizontally in the programmable logic array. A one-segment module can be placed with a one, two, or three segment module.

In this embodiment, all steps remain the same as for the presently-preferred embodiment except for two exceptions. In step 301, the intermediate circuit modules are created so that their horizontal size is an integral number of segments, not the width of the entire programmable logic array. In step 302, finding an unused portion looks for an unused portion that is both of sufficient vertical size, as in the presently-preferred embodiment, and sufficient number of horizontal segments.

In another embodiment, the programmable logic array is regarded as a number of equally-sized cells, each of a fixed horizontal and vertical size. Each cell can communicate with its neighbors, and can receive global signals through either vertical bundles, horizontal bundles, or both, spaced so that they have the same relative position in each cell. The circuit modules are all of the same size, so they can be placed in any cell within the programmable logic array.

This embodiment is particularly well suited for placing logic based on the contents of array-oriented data, such as the bits of a pixel. For example, one type of intermediate circuit module would be placed at each cell corresponding to a pixel value of 1, while another type of intermediate circuit module would be placed at each cell corresponding to a pixel value of 0. Computation is then performed, controlled by global signals in each bundle. Following that computation, new intermediate circuit modules are placed, based on the new pixel values just computed.

Distribution on Computer-Readable Medium

Computer programs implementing the method of this invention will commonly be distributed to users on a computer-readable medium such as floppy disk or CD-ROM. From there, they will often be copied to a hard disk or a similar intermediate storage medium. When the programs are to be run, they will be loaded either from their distribution medium or their intermediate storage medium into the execution memory of the computer, configuring the computer to act in accordance with the method of this invention. All these operations are well-known to those skilled in the art of computer systems.

Digital Processors

The method just discussed provides a strong foundation for implementing a digital processor that can be adapted to different applications. In such a digital processor, the programmable logic arrays implementing the processor are configured for a particular application, the operations of that application are performed, and the programmable logic arrays are then programmed for the next application. Rather than have a conventional digital computer with a general arithmetic-logic unit handing the computations, computation engines can be formed from one or more programmable logic arrays. These computation engines efficiently perform the logical and computational operations desired for the particular application. One or more programmable logic arrays can also be used to control the computation engines, or a single programmable logic array could contain both the computation engines and their control logic.

Using the method, it is possible to assemble the computation engine and its control logic for a portion of the application into an application-specific instruction module, store that module in a configuration library, and then place that application-specific instruction module into the instruction space of the programmable digital processor formed by the programmable logic arrays whenever that portion of the application is to be performed. Instruction modules are then simply a form of the circuit modules previously discussed.

Figure 5A:
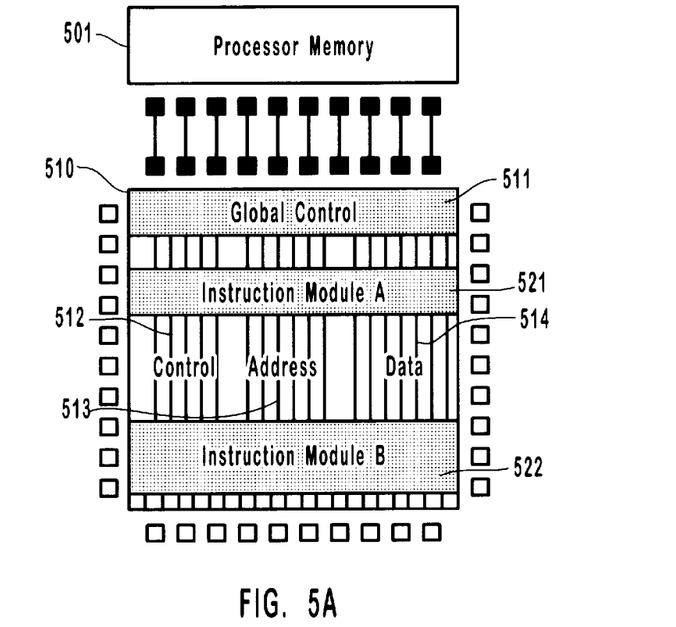
FIGS. 5a and 5b illustrate a digital processor implemented using the method of the invention.
Figure 5B:
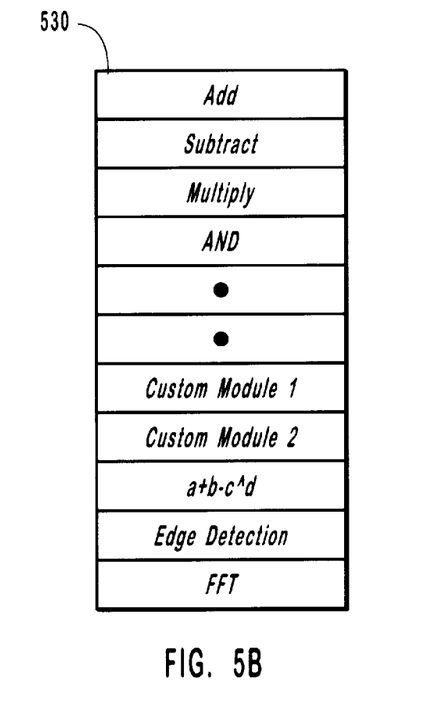

FIGS. 5a and 5b illustrate a digital processor implemented using the method of the invention. The digital processor comprises two major components: processor memory 501, a conventional random-access memory (RAM) as would be found on a conventional computer, and programmable logic array 510, which may be implemented using a plurality of programmable logic array integrated circuits interconnected to effectively form a large programmable logic array.

Programmable logic array 510 contains global control circuitry 511, control signal buss 512, address signal buss 513, and data signal buss 514. In the embodiment of the digital processor based on the presently-preferred embodiment of the method of the invention, global control 511 is implemented as a portion of programmable logic array 510 spanning the horizontal width of programmable logic array 510. Busses 512, 513, and 514 are global signal lines running vertically in programmable logic array 510.

Global control 511 provides circuitry for operating and monitoring global resources, such as processor memory 501 and any input/output lines to the digital processor. Global control 511 also controls the use of busses 512, 513, and 514, and any other internal communications, and contains the global state of the digital processor. Such global state may include the contents of one or more registers or accumulations and various status bits, as required by the particular application.

Since programmable logic array 510 can be reconfigured by loading the SRAM memory elements, it is possible to have different designs for the global controller for different applications being run on the digital processor. External logic, possibly under the control of a conventional digital computer, can load the appropriate global control before the application is started, much like circuit modules are loaded into programmable logic array 510 as the application is running.

FIG. 5a shows two instruction modules, 521 and 522, currently loaded into programmable array 51C. These instruction modules are specific forms of the circuit modules previously discussed. They are designed to access busses 512, 513, and 514 and follow particular protocols and control sequences so that they interoperate with global control 511.

In the presently-preferred embodiment of the digital processor, global control 511 is responsible for sequencing through the instruction cycles for each instruction module. Two instruction modes are supported: standard and complex. The standard instruction sequence follows a simple three-cycle execution. Instructions that require minimal processing time, such as basic arithmetic and logic operations, operate with this sequence.

The custom-instruction sequence allows additional cycles for instructions that need significantly more time than traditional low-level instructions. Some instructions may add as few as one additional cycle, while others may require thousands of cycles for a single operation. For example, a custom instruction may implement an entire FFT operation as a single instruction.

Global control 511 also can contain instruction modules for standard instructions, such as read-from-memory or conditional-jump.

In the presently-preferred embodiment of the digital processor, each instruction module contains control logic that recognizes an instruction code corresponding to the function performed by the instruction module, and returns a acknowledgment signal to global control 511 in response to that recognition. If no acknowledgment signal is returned, global control 511 knows that an instruction module for performing the function is not currently loaded. Global control 511 initiates the loading of the appropriate intermediate circuit module from configuration library 530 of FIG. 5b using the method discussed previously. This can be done either using logic included in control module 511, or by signaling an instruction-module-not-loaded fault to a controlling digital computer, and halting the digital processor until the appropriate instruction module has been loaded by the digital computer.

When a loaded instruction module recognizes its instruction code, its control logic operates in conjunction with global control 511 to sequence the computation engine in the instruction module and the global logic in global control 511. When the desired operation has completed, control returns to global control 511 and the next instruction is sent to the instruction modules for recognition and execution.

It is to be understood that the above described embodiments are merely illustrative of numerous and varied other embodiments which may constitute applications of the principles of the invention. Such other embodiments may be readily devised by those skilled in the art without departing from the spirit or scope of this invention and it is our intent they be deemed within the scope of our invention.

We claim:

1. A method for designing a programmable logic array, said programmable logic array comprising a plurality of programmable elements, said method comprising:

A. creating an intermediate circuit module within a programmable logic array such that said intermediate circuit can be relocated within said programmable logic array, wherein said intermediate circuit module contains an application-specific instruction module containing a computational engine as control logic and wherein said intermediate circuit module is readable from a configuration library;

B. finding an unused portion of said programmable logic array of sufficient size to hold said intermediate circuit module and, if said programmable logic array does not have available sufficient space as a control block, rearranging one or more preexisting circuit modules to provide a sufficiently sized space in said programmable logic array;

C. producing a final circuit module by relocating said intermediate circuit module such that it can be placed in said unused portion; and D. configuring said programmable logic array by placing said final circuit module into said programmable logic array at said unused portion.

2. A method as in claim 1, where said programmable elements comprise routing elements.

3. A method as in claim 1, where said programmable elements comprise logic elements.

4. A method as in claim 1, where said programmable elements comprise both routing elements and logic elements.

5. A method as in claim 1, where said programmable logic array is organized using a linear hardware space comprising vertical signal lines, and said intermediate circuit module horizontally overlays all said vertical global signal lines.

6. A method as in claim 5, where said relocation comprises vertically offsetting said intermediate circuit module.

7. A method as in claim 1, where said programmable logic array has a plurality of equally-sized horizontal segments, and said intermediate circuit modules have a horizontal size equal to an integral number of said equally-sized horizontal segments.

8. A method as in claim 1, where said programmable logic array has a plurality of equally-sized cells, and said intermediate circuit modules all have a size equal to the size of said equally-sized cells.

9. A programmable digital processor having a programmable logic array programmed using the method of claim 1.

10. A programmable digital processor as in claim 9, where said programmable logic array forms an instruction space adapted by application-specific instruction modules.

11. A programmable digital processor having a plurality of programmable logic arrays programmed using the method of claim 1.

12. A programmable digital processor as in claim 11, where said plurality of programmable logic arrays form an instruction space adapted by application-specific instruction modules.

13. A programmable digital processor having a programmable logic array programmed using the method of claim 6.

14. A programmable digital processor as in claim 13, where said programmable logic array forms an instruction space adapted by application-specific instruction modules.

15. A computer-readable medium storing a computer program implementing the method of claim 1.

16. A computer-readable medium as in claim 15, where said computer-readable medium is a floppy disk.

17. A computer-readable medium as in claim 15, where said computer-readable medium is a CD-ROM.

18. A computer-readable medium as in claim 15, where said computer-readable medium is a hard disk.

19. A computer-readable medium storing a computer program, where said computer program configures a computer to act in accordance with the method of claim 1.

20. A computer-readable medium as in claim 19, where said computer-readable medium is a floppy disk.

21. A computer-readable medium as in claim 19, where said computer-readable medium is a CD-ROM.

22. A computer-readable medium as in claim 19, where said computer-readable medium is a hard disk.

23. A computer-readable medium storing a computer program implementing the method of claim 6.

\* \* \* \* \*

UNITED STATES PATENT AND TRADEMARK OFFICE
CERTIFICATE OF CORRECTION

| | |
|---|---|
| PATENT NO. | : 6,173,434 B1 |
| APPLICATION NO. | : 08/787402 |
| DATED | : January 9, 2001 |
| INVENTOR(S) | : Michael J. Wirthlin and Brad L. Hutchings |

It is certified that error appears in the above-identified patent and that said Letters Patent is hereby corrected as shown below:

Title page, item [60] please insert the following after the "File:" data:
--Related U.S. Application Data
(60) Provisional application No. 60/015,929, filed on April 22, 1996.--

Please insert the following after the patent title and before "Background of the Invention":
--Cross Reference to Related Applications
This application is based on a U.S. Provisional Application Serial No. 60/015,929 which was filed on April 22, 1996, and priority is claimed thereto.--

Signed and Sealed this

Sixth Day of October, 2009

David J. Kappos
*Director of the United States Patent and Trademark Office*